United States Patent

Galbi et al.

Patent Number: 5,221,864
Date of Patent: Jun. 22, 1993

[54] STABLE VOLTAGE REFERENCE CIRCUIT WITH HIGH VT DEVICES

[75] Inventors: Duane E. Galbi, Jericho; Russell J. Houghton, Essex Junction, both of Vt.

[73] Assignee: International Business Machines Corporation, Armonk, N.Y.

[21] Appl. No.: 809,608

[22] Filed: Dec. 17, 1991

[51] Int. Cl.$^5$ ............................................. H03K 3/01
[52] U.S. Cl. ............................... 307/296.8; 307/296.1
[58] Field of Search ............... 307/296.1, 296.6, 296.8, 307/264, 350, 363, 272.3

[56] References Cited

U.S. PATENT DOCUMENTS

| | | | |
|---|---|---|---|
| 3,823,332 | 7/1974 | Feryszka et al. | 307/296.8 |
| 4,064,448 | 12/1977 | Eatock | 323/22 |
| 4,096,430 | 6/1978 | Waldron | 307/296.8 |
| 4,317,054 | 2/1982 | Caruso et al. | 307/297 |
| 4,451,744 | 5/1984 | Adam | 307/297 |
| 4,454,467 | 6/1984 | Sakaguchi | 323/313 |
| 4,553,098 | 11/1985 | Yoh et al. | 324/433 |
| 4,645,998 | 2/1987 | Shinohara et al. | 307/296.8 |
| 4,663,584 | 5/1987 | Okada et al. | 323/313 |
| 4,670,706 | 6/1987 | Tobita | 323/313 |
| 4,812,735 | 3/1989 | Sawada et al. | 323/313 |
| 4,814,686 | 3/1989 | Watanabe | 323/229 |
| 4,833,342 | 5/1989 | Kiryu et al. | 307/296.1 |
| 4,839,535 | 6/1989 | Miller | 307/296.7 |
| 5,109,187 | 4/1992 | Guliani | 307/296.6 |

OTHER PUBLICATIONS

S. H. Dhong et al., "Silicon Band-Gap Reference Voltage Generators Based on Dual Polysilicon MOS Transistors," IBM Technical Disclosure Bulletin, vol. 32, No. 9B, Feb. 1990, pp. 4-5.

Ser. No. 07/810,000 "Boosted Drive System for Master/Local Word Line Memory Architecture," D. E. Galbi et al., Filed Dec. 18, 1991.

Primary Examiner—Jin F. Ng
Assistant Examiner—Sinh Tran
Attorney, Agent, or Firm—Mark F. Chadurjian

[57] ABSTRACT

A voltage reference circuit that produces an output offset from a supply voltage by approximately two volts, the output being relatively stable in the face of vacillations in the external power supplies. The first leg of the circuit utilizes devices having differing Vt's to produce an internal reference of one volt below Vdd. In a first embodiment of the invention, the second leg has a first device that is diode connected, wherein the gate receives the internal reference and the source is at the high power supply, and a second high Vt diode connected device. The two devices are matched to have the same overdrive current, which is at a voltage that is a function of the difference between the gate-to-source voltage of the first device and the threshold voltage of the first device. Thus, the output is a function of the overdrive to, and the diode drop across, the second high-Vt device.

16 Claims, 3 Drawing Sheets

STABLE VOLTAGE REFERENCE CIRCUIT WITH HIGH VT DEVICES

CROSS REFERENCE TO RELATED APPLICATIONS

Reference is made to co-pending U.S. patent application Ser. No. 07/810,000 by Galbi et al, entitled "Boosted Drive System for Master/Local Word Line Memory Architecture," filed concurrently herewith and assigned to the assignee of the present invention. This Application is directed to a boosted word line driver system, the preferred embodiment of which utilizes the present invention to control the voltage on the charge reservoir.

BACKGROUND OF THE INVENTION

1. Technical Field

The invention relates generally to voltage reference circuits, and more particularly to a stable voltage generator that is immune to variations in the supply voltage.

2. Background Art

Throughout the development of integrated circuit technology, various methods have been used to provide supply voltages on-chip. Originally, power supply busses were simply coupled to the various circuit elements directly. This led to problems due to power supply instabilities. Therefore various buffering methods (such as the use of decoupling capacitors) have been used to isolate the external power supply from the power inputs.

More recently, the need has developed for the ability to generate power supply voltages on-chip that are different from those available externally. One such example is in dynamic random access memories (DRAMs). As discussed in the above-mentioned copending U.S. patent application Ser. No. 07/810,000 by Galbi et al., it is necessary to generate a boost voltage so that the DRAM cells can be restored to a full "1" potential at the completion of a read cycle. By definition, such boost voltages exceed the high power supply (Vdd) available from the microprocessor. In order to provide a stable boost voltage, such systems have a particular need for stable input supplies that are immune to external power supply variations.

U.S. Pat. No. 4,451,744, "Monolithic Integrated Reference Voltage Source" (issued May 1984 to Adam and assigned to ITT Industries) discloses a voltage source that utilizes two cascaded, diode-connected FETs. A first FET has its source connected to Vdd and its drain connected to the output. A second FET has its source coupled to the output and its drain connected to ground. The gate of the first FET is connected to ground, and the gate of the second FET is connected to the source of the first FET. The first FET is a depletion type FET, and the second FET is an enhancement type FET. In combination, the difference in the diode drops produced by the difference in threshold voltage between the enhancement and depletion devices produces a stable output voltage. U.S. Pat. No. 4,814,686, "FET Reference Voltage Generator Which Is Impervious To Input Voltage Fluctuations," (issued March 1989 to Watanabe and assigned to Toshiba) discloses a voltage reference circuit in which a cascaded diode network provides an input voltage to another diode network, the two networks receiving different input currents, so as to provide a stable supply.

Other examples of voltage references that rely on diode differences to provide an output that is more immune to power supply variations include U.S. Pat. No. 4,064,448, "Band Gap Voltage Regulator Circuit Including A Merged Reference Voltage Source And Error Amplifier," (issued February 1977 and assigned to Fairchild); U.S. Pat. No. 4,317,054, "Bandgap Voltage Reference Employing Sub-Surface Current Using A Standard CMOS Process," (issued February 1982 and assigned to Mostek); U.S. Pat. No. 4,670,706, "Constand Voltage Generating Circuit," (issued June 1987 and assigned to Mitsubishi); U.S. Pat. No. 4,839,535, "MOS Bandgap Voltage Reference Circuit," (issued June 1989 and assigned to Motorola); and the article "Silicon Band-Gap Reference Voltage Generators Based On Dual Polysilicon MOS Transistors," *IBM Technical Disclosure Bulletin,* Vol. 2, No. 9B, February 1990, pp. 4–5.

Although most of the circuits disclosed above provide relatively stable supplies, they do so at the cost of high device counts and multiple current paths that result in higher power burn and poor Vdd excursion tolerance. Accordingly, a need has developed in the art for a relatively simple voltage reference circuit that has a minimum of current paths, and improved power supply excursion tolerance, and yet is insensitive to variations in external power supplies.

SUMMARY OF THE INVENTION

It is thus an object of the present invention to provide a voltage source that has a low device count, a minimum of current paths, and stability to variations in external power supplies.

It is another object of the invention to provide a circuit that produces a stable output voltage level of two volts above a low supply voltage, or two volts below a high supply voltage, wherein output level can be varied by relatively simple modifications to the circuitry.

The foregoing and other objects of the invention are realized by a circuit that utilizes a diode-coupled high threshold FET in conjunction with an FET that produces an overdrive current, to output a voltage that is offset from a power supply voltage by an amount equivalent to the high threshold plus the voltage of the overdrive current. In a first embodiment of the invention, the circuit is constructed to output a voltage level of two volts above the low power supply. In a second embodiment of the invention, the circuit is constructed to output a voltage level of two volts below the high power supply. In either case, the voltage level may be adjusted by controlling the gate bias on the FET that produces the overdrive, and by selecting between multiple high-Vt FETs to optimize transconductance matching.

BRIEF DESCRIPTION OF THE DRAWING

The foregoing and other features of the invention will be more apparent upon review of the detailed description of the best mode for carrying out the invention, as rendered below. In the description to follow, reference will be made to the accompanying Drawing, in which.

DETAILED DESCRIPTION OF THE BEST MODE FOR CARRYING OUT THE INVENTION

Figure 1:
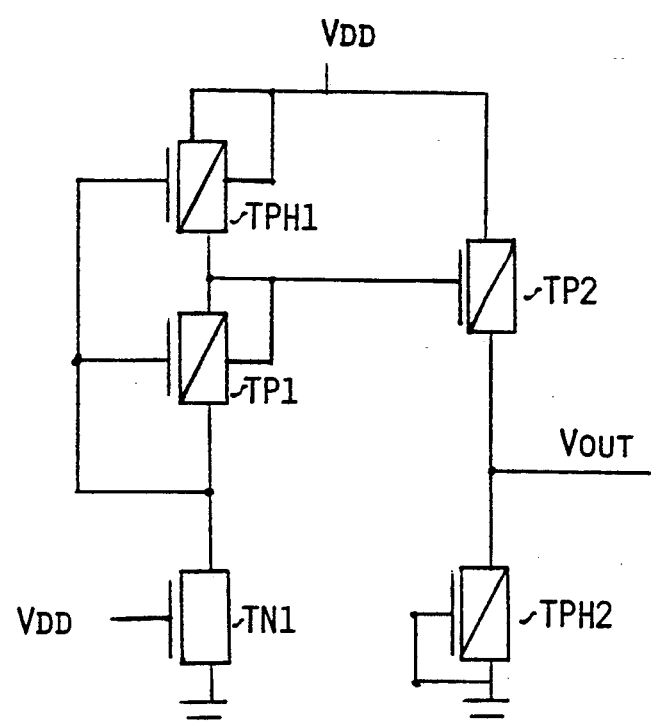
FIG. 1 is a circuit diagram of a first embodiment of the present invention.
Figure 2:
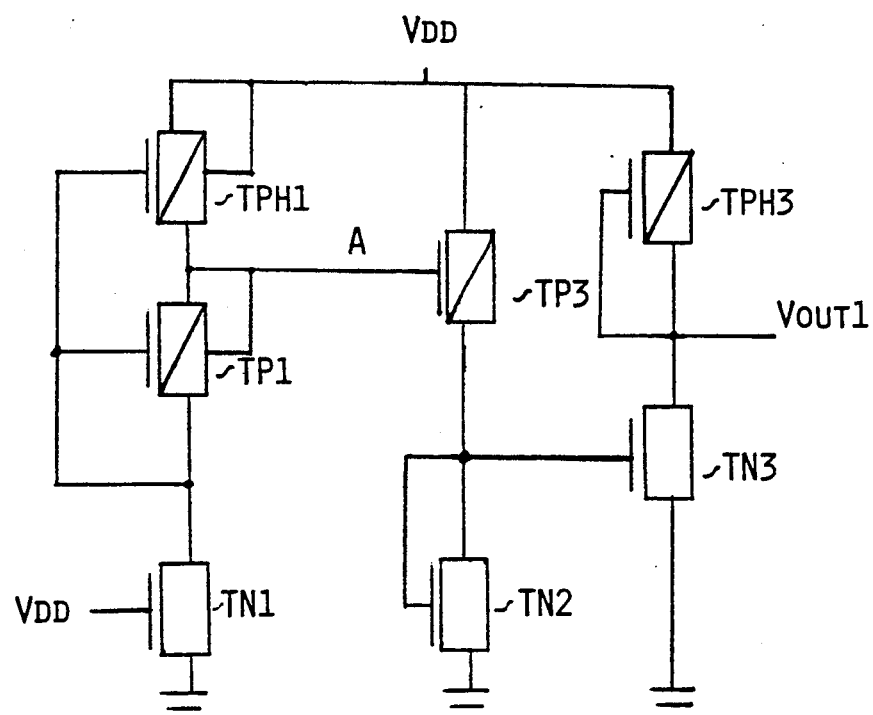
FIG. 2 is a circuit diagram of a second embodiment of the present invention.
Figure 3:
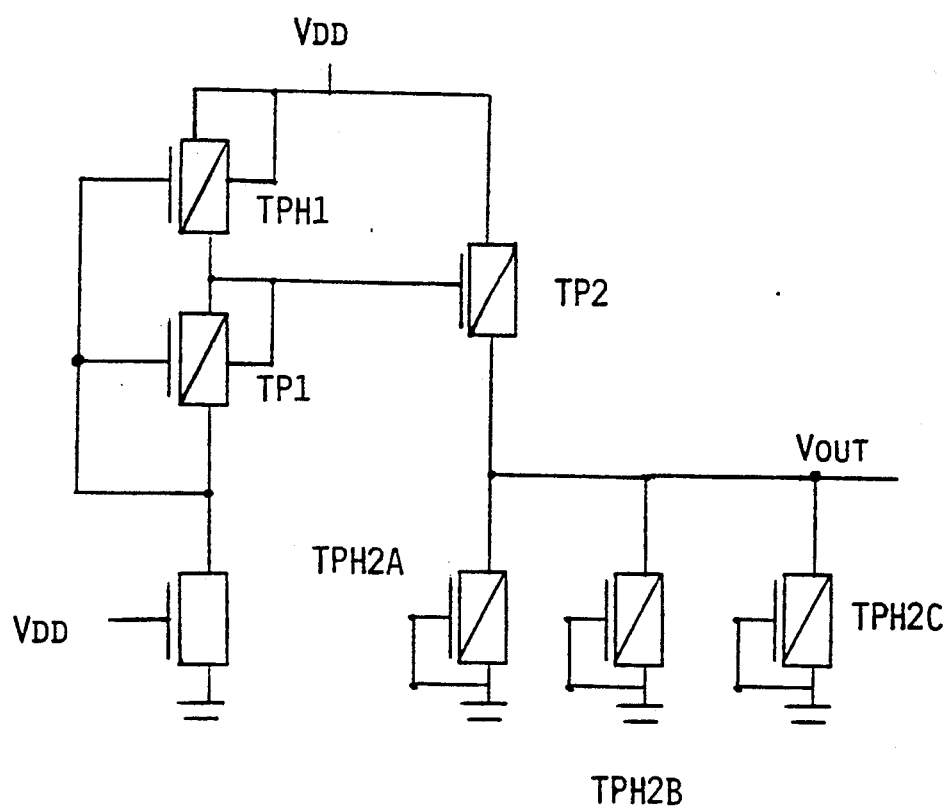
FIG. 3 is a circuit diagram of a modification to the embodiment of the invention shown in FIG. 1.

With reference to FIG. 1, a first embodiment of the reference voltage circuit of the invention is shown. In the depicted circuit, all of the transistors that have a reference symbol including a "P" are p-type FETs, and all of the transistors that have a reference symbol including an "N" are n-type FETs. Also, the transistors that have a reference symbol including an "H" are p-type FETs that have a higher threshold voltage than do the other PFETs in the circuit. While this difference in threshold voltage could be produced in any one of a number of ways, in the invention it is preferred to use different work function materials (such as n-implanted and p-implanted polysilicon) as the gate electrodes for the respective PFETs. This difference in threshold could also be generated by introducing an additional n-type surface implant into the channel regions of the high-Vt PFETs. In either case, the high-Vt PFETs are formed in their own separate n-type well region. In some cases the bias of the well region is indicated by the device reference line that extends from one of the drain electrodes to the channel region of the device. In practice, all of the PFETs shown in FIGS. 1-3 are disposed in wells that are biased at the potential of their respective source electrodes.

The first leg of the circuit consists of devices TPH1, TP1, and TN1. Device TN1 has its gate coupled to Vdd (=3.3 volts), and thus serves as a current source for the first leg. The gates of both TPH1 and TP1 are connected between the drain of TP1 and the drain of TN1, and the source of TP1 is connected to the drain of TPH1. The source of TPH1 is connected to Vdd. TPH1 and TP1 have substantially the same transconductance (or current carrying characteristics, which is the product of channel characteristics such as doping, area, charge mobility, etc. and gate characteristics such as gate oxide thickness etc.). Thus they have the same current flowing through them (approximately 5 microamps) from TN1.

TPH1 and TP1 operate in the saturation region at the current flow induced by TN1. At the 5 microamp current induced by TN1, both TPH1 and TP1 provide a diode drop across them that is equivalent to their respective threshold voltages. The threshold voltage of TPH1 is approximately 1.6 volts, and that of TP1 is approximately 0.6 volts. Thus, the voltage drop between the source of TPH1 and its gate (i.e., at the drain of TP1, because of the interconnection to the gate of TPH1) will be 1.6 volts, the Vt of TPH1, and the voltage drop between the source and drain of TP1 is 0.6 volts, the Vt of TP1. As such, the voltage at the source of TP1 is (Vdd+ −1.6+0.6), or Vdd minus one volt. The voltage on the source of TP1 biases the gate electrode of TP2 of the second leg of the circuit of the invention.

Note that the description above was for steady state conditions in which Vdd is substantially constant. Should Vdd increase significantly, the current supplied by TN1 will increase and the overdrive on TPH1 and TP1 will correspondingly increase. However, the overdrive of TPH1 and TP1 compensate each other, resulting in a constant voltage of Vdd-1 at the source of TP1 that is immune to Vdd excursions.

The second (or output) leg of the reference voltage generator of the first embodiment of the invention converts the Vdd-1 voltage on the gate of TP2 to an output voltage of 2 volts above ground potential. The output leg includes TP2, which has a source coupled to Vdd and a drain coupled to the output, and TPH2, which has its gate and drain coupled to ground and its source coupled to the output. Since the gate of TP2 is at a voltage of one volt below Vdd, strictly speaking it is not diode connected because the source and gate are not at the same voltage. However, because of this constant voltage applied at the gate of the device, the transistor will operate in the saturation region, exhibiting a current at the drain. This current generates the same overdrive on TPH2, because similarly to the first leg as described above TPH2 and TP2 are made to have substantially the same transconductance. Because the voltage on the gate of TP2 is below the source by one volt, and the threshold of TP2 is 0.6 volts, the overdrive voltage to TPH2 will be at a voltage of 1.0–0.6, or 0.4 volts. Since as explained above the overdrive to TPH2 is also 0.4 volts, wherein TPH2 has a threshold of 1.6 volts and is connected in a diode configuration, the voltage at Vout is 1.6 plus 0.4, or two volts above ground. Note that the drop across TPH1 is due to the diode characteristic and the supplied overdrive, such that the output voltage is independent of Vdd.

A second embodiment of the invention is shown in FIG. 2. Instead of supplying a voltage of two volts above ground as in FIG. 1, the circuit of FIG. 2 supplies an output voltage Vout1 that is two volts below the supply voltage Vdd. Devices TPH1, TP1, and TN1 are the same as like designated devices in FIG. 1, such that the voltage on line A is the same one volt below Vdd output of the first leg of the circuit of FIG. 1. Devices TP3 and TPH3 have similar transconductances, as do devices TN2 and TN3, such that by virtue of their gate interconnections TN2 and TN3 provide a current mirror function. As such, the currents in the second and third legs of the circuit of FIG. 2 are the same. Therefore, device TPH3 sees the same overdrive voltage as did device TPH2 in FIG. 1, such that the same 0.4 overdrive voltage plus 1.6 volt diode drop is generated across TPH3. However, because TPH3 is coupled to the high supply voltage Vdd, the output Vout1 is two volts below Vdd, (i.e., 1.3 volts when Vdd is 3.3 volts), rather than two volts above ground as in FIG. 1.

FIG. 3 shows a modification to the second leg of the circuit shown in FIG. 1. In order to generate the desired voltage drop across TPH2 in FIG. 1, it is important that the transconductances of TPH2 and TP2 be as similar as possible. As previously described, the transconductances are a function of many process variables that affect the channel region. It may be difficult to maintain sufficient transconductance similarity in volume manufacturing operations. Therefore, instead of using a single device TPH2, multiple devices TPH2A, TPH2B, TPH2C are provided. The transconductances of these devices may be made slightly different using any one of a number of known techniques; in the invention this difference is achieved by changing the width-to-length ratios of the respective devices. An appropriate one of the TPH2A-C devices is selected by either masking out the other devices during definition of the contacts from the first level of metal to the output node or the other voltages (such that only the selected device is coupled to all of the ground, TP2, and Vout circuit elements), or by selectively blowing fuses disposed between the source electrodes of the respective devices and Vout. This technique could also be applied to the embodiment of the invention shown in FIG. 2, by simply adding more devices TPH3A, TPH3B, TPH3C, etc. between Vdd and Vout1 in the same manner as devices TPH2A-C shown in FIG. 3.

Thus, in the invention a stable voltage is generated that is offset by two volts from either voltage supply, wherein the output is relatively immune to changes to the power supply potentials. A feature of the invention is that relatively straightforward modifications can be made to change the output voltage level, without compromising the stability and other desirable features of the invention. For example, by changing the first leg by adding more diode drops, the bias on the gate of TP2 relative to Vdd can be changed, to thus change the overdrive to TPH2 and thus the output voltage. Voltages other than Vdd and ground (e.g., a boosted word line voltage of 4 volts as in the aforementioned co-pending application by Galbi et al.) could be supplied to the circuit, such that the output voltage is a two-volt offset from such voltage (e.g., two volts below the boost voltage). Also, similarly to TP2, the gate bias on TPH2 can be varied relative to ground, to vary the overdrive seen by TPH2. The transconductances of the devices could be intentionally varied to change the voltage output. Other modifications along these lines may be made to the circuitry as shown, without departing from the spirit and scope of the invention.

What is claimed is:

1. A voltage reference circuit for generating a stable output voltage at an output node, comprising:
   a first FET having a first controlled electrode coupled to a supply voltage, a second controlled electrode coupled to the output node, and a gate electrode coupled to one of said first and second controlled electrodes, said first FET having a first threshold voltage;
   bias means for producing a bias voltage at a bias node, said bias means comprising a current source, and second and third transistors coupled in series between said supply voltage and said current source, said bias node being coupled to the junction between said second and third transistors, said second and third transistors having gate electrodes that are interconnected and coupled to said current source; and
   first means coupled to said bias node for supplying an overdrive voltage to one of said controlled electrodes of said first FET, said first means having a second threshold voltage that is less than said first threshold voltage, said overdrive voltage being equivalent to a difference between said bias voltage and said second threshold voltage, said first FET and said first means driving the output node to a voltage that is offset from said supply voltage by a voltage equivalent to said first threshold voltage plus said overdrive voltage.

2. The voltage reference circuit of claim 1, wherein said second threshold voltage is approximately one volt less than said first threshold voltage.

3. The voltage reference circuit of claim 2, wherein said bias voltage is approximately one volt below said supply voltage.

4. The voltage reference circuit of claim 3, wherein said first threshold voltage is approximately 1.6 volts.

5. The voltage reference circuit of claim 4, wherein said supply voltage is approximately 3.3 volts, and said output voltage at said output node is approximately 1.3 volts.

6. The voltage reference circuit of claim 4, wherein said supply voltage is approximately 4 volts, and said output voltage at said output node is approximately 2 volts.

7. The voltage reference circuit of claim 4, wherein said supply voltage is at ground potential, and said output voltage at said output node is approximately 2 volts.

8. A voltage reference circuit for producing a stable voltage at an output node, comprising:
   bias means for producing a bias voltage at a bias node, said bias means comprising a current source, said first and second transistors coupled in series between a first power supply potential and said current source, said bias node being coupled to the junction between said first and second transistors, said first and second transistors having gate electrodes that are interconnected and coupled to said current source, said bias voltage being offset from said first power supply potential by a first constant voltage;
   a first FET having a first threshold voltage and a first transconductance, said first threshold voltage being less than said first constant voltage, a first controlled electrode coupled to said first power supply potential, a gate electrode coupled to said bias node, such that said first FET has an overdrive voltage equivalent to a difference between said bias voltage and said first threshold voltage, and a second controlled electrode coupled to the output node; and
   a second FET having a second threshold voltage that exceeds said first threshold voltage in absolute value and a second transconductance that is substantially equivalent to said first transconductance, a first controlled electrode coupled to the output node, a second controlled electrode coupled to a second power supply potential, and a gate electrode coupled to one of said controlled electrodes of said second FET,
   said first and second FETs driving the output node to a voltage that is offset from said second power supply potential by an amount equivalent to said second threshold voltage plus said overdrive voltage.

9. The voltage reference circuit of claim 8, wherein said second transistor has said second threshold voltage, and said third transistor has said first threshold voltage.

10. The voltage reference circuit of claim 1, wherein said first FET is selected from a plurality of selectable transistors, each having a transconductance that is different from the transconductances of other ones of said plurality of selectable transistors.

11. The voltage reference circuit of claim 10, wherein said first FET is selected by coupling a controlled electrode of a selected one of said selectable transistors to the output node.

12. The voltage reference circuit of claim 11, wherein said first FET is selected by coupling a gate electrode and first and second controlled electrodes of said a selected one of said selectable transistors to one of said first and second controlled electrodes of said selected one of said selectable transistors, said supply voltage, and the output node respectively.

13. A voltage reference circuit receiving a high power supply potential Vdd and a low power supply potential for producing an output voltage at an output node, comprising:

bias means including a bias node for producing a constant voltage of Vdd-1 at said bias node;

a first FET having a gate electrode coupled to said bias node, a first controlled electrode coupled to Vdd, and a second controlled electrode, said first FET having a first threshold voltage, said first FET producing a current at said second controlled electrode at a voltage equivalent to the difference between Vdd-1 and said first threshold voltage;

a second FET having a first controlled electrode coupled to Vdd and both a gate electrode and a second controlled electrode coupled to the output node, said first FET having a second threshold voltage that is greater than said first threshold voltage; and current mirror means comprising third and fourth FETs having interconnected gate electrodes, said third FET being coupled between said low power supply potential and said second controlled electrode of said first FET, and said fourth FET being coupled between said low power supply potential and the output node, for producing a current into said second FET that is substantially similar to said current produced by said first FET, said third nd fourth FETs having substantially similar transconductances.

14. The voltage reference circuit of claim 13, wherein said bias means comprises, a current source, first and second bias transistors coupled in series between Vdd and said current source, said first and second bias transistors having gate electrodes that are interconnected and coupled to said current source, and a bias node coupled to the junction between said first and second bias transistors and to said gate electrode of said first FET.

15. The voltage reference circuit of claim 14, wherein said first bias transistor has said second threshold voltage, and said second bias transistor has said first threshold voltage.

16. The voltage reference circuit of claim 13, wherein said second FET is selected from a plurality of selectable transistors, each having a transconductance that is different from the transconductances of other ones of said plurality of selectable transistors.

* * * * *